United States Patent [19]
Temple et al.

[11] Patent Number: 5,142,167
[45] Date of Patent: Aug. 25, 1992

[54] ENCODING FOR SIMULTANEOUS SWITCHING OUTPUT NOISE REDUCTION

[75] Inventors: Joseph L. Temple, Hurley; Richard F. Rizzolo, Red Hook; Charles B. Winn, Hyde Park, all of N.Y.

[73] Assignee: International Business Machines Corporation, Armonk, N.Y.

[21] Appl. No.: 694,178

[22] Filed: May 1, 1991

[51] Int. Cl.⁵ .......................................... H03K 17/16
[52] U.S. Cl. .............................. 307/443; 307/480; 341/102
[58] Field of Search ............... 307/443, 449, 463, 480; 341/98, 102, 103

[56] References Cited

U.S. PATENT DOCUMENTS

| | | | |
|---|---|---|---|
| 4,508,981 | 4/1985 | Dorler et al. | 307/542 |
| 4,587,445 | 5/1986 | Kanuma | 307/443 |
| 4,609,834 | 9/1986 | Gal | 307/200 |
| 4,618,849 | 10/1986 | Bruestle | 341/98 |
| 4,644,265 | 2/1987 | Davidson et al. | 324/73 |
| 4,656,370 | 4/1987 | Kanuma | 307/443 X |
| 4,661,928 | 4/1987 | Yasuoka | 365/189 |
| 4,667,337 | 5/1987 | Fletcher | 377/41 |
| 4,724,340 | 2/1988 | Sood | 307/443 |
| 4,725,747 | 2/1988 | Stein et al. | 307/579 |
| 4,791,521 | 12/1988 | Ouyang et al. | 361/91 |
| 4,827,160 | 5/1989 | Okano | 307/443 |
| 4,855,742 | 8/1989 | Venboom | 341/103 X |
| 4,857,765 | 8/1989 | Cahill et al. | 307/443 |
| 4,864,164 | 9/1989 | Ohshima et al. | 307/443 |
| 4,890,010 | 12/1989 | Neudeck et al. | 307/270 |
| 4,975,698 | 12/1990 | Kagey | 341/98 X |
| 5,016,258 | 5/1991 | Tanaka et al. | 341/102 X |
| 5,025,256 | 6/1991 | Stevens | 341/102 X |

FOREIGN PATENT DOCUMENTS 0148426 8/1984 Japan ................................. 307/443

Primary Examiner—David Hudspeth
Attorney, Agent, or Firm—Blaney Harper; Lauren Bruzzone

[57] ABSTRACT

This invention reduces the Delta I noise on an integrated circuit chip by reducing the changes in current supply required for transitions in logic states of the input/output devices. The invention uses a 3/6 binary code for communicating between integrated circuit chips. This code uses six bits to represent the 16 hex code digits typically used for computer instructions. Three of the six bits are in a high logic state and three of the six bits are in a low logic state for all 16 hex code representations. Therefore, changing from any one logic state to another, does not change the overall current supply required by the six input/output devices. Groups of six input/output devices (corresponding to the 3/6 code) are located relatively close to each other with respect to the power supply pins which supply current to the six input/output devices. As a result, there is a high to low transition for every low to high transition over similar parasitic impedances on the input/output devices. This leads to low Delta I noise because the noise created by individual transitions cancel each other out when viewed as a six device group. The high overhead pin count for a six digit code instead of the normal four digit code for hex representation is compensated for because input/output pins normally replaced by extra power supply pins (to reduce Delta I noise) can be used as input/output pins. Therefore, the 3/6 code frees up extra input/output pins when the Delta I noise would normally force those pins to be used for power supply.

19 Claims, 5 Drawing Sheets

| 3/6 CODE (xy a'b'c'd') | HEX DIGIT | BINARY (abcd) |
|---|---|---|
| 01 1100 | 0 | 0000 |
| 11 0001 | 1 | 0001 |
| 11 0010 | 2 | 0010 |
| 01 0011 | 3 | 0011 |
| 11 0100 | 4 | 0100 |
| 01 0101 | 5 | 0101 |
| 01 0110 | 6 | 0110 |
| 00 0111 | 7 | 0111 |
| 11 1000 | 8 | 1000 |
| 10 1001 | 9 | 1001 |
| 10 1010 | A | 1010 |
| 00 1011 | B | 1011 |
| 10 1100 | C | 1100 |
| 00 1101 | D | 1101 |
| 00 1110 | E | 1110 |
| 10 0011 | F | 1111 |

BINARY (a,b,c,d) CONVERSION TO 3/6 (x,y,a',b',c',d') CODE

3/6 ( X,Y, a',b',c',d') CONVERSION TO BINARY (a,b,c,d) CODE c' —————————————— c = c' d' —————————————— d = d'

5,142,167

ENCODING FOR SIMULTANEOUS SWITCHING OUTPUT NOISE REDUCTION

FIELD OF THE INVENTION

This invention relates generally to the field of electrical transmission and interconnections systems. More particularly, the invention relates to nonlinear solid state systems for improving transmission sensitivity.

BACKGROUND OF THE INVENTION

The fabrication of high performance Very Large Scale Integrated (VLSI) devices permits the use of many functions on a single integrated circuit chip. The functional blocks on a single chip must be connected with a variety of other chips in order to receive data and communicate results within a computer system. Communication between chips or functional blocks is faster when the data is transmitted in parallel over a large number of interconnections. The electrical behavior of interconnections between functional blocks on a single chip is different than the behavior of interconnections between chips. The electrical resistance, capacitance, and inductance associated with packaging and interconnecting multiple chips affects the switching transitions of the signals sent between chips. Therefore, output drivers are used to compensate for these effects.

The output drivers make the signal voltage on the output driver as low as possible for a first logic state (i.e., logic 0) and as high as possible for a second logic state (i.e., logic 1). Often, the output driver signal swing voltage is made larger than signals between functional blocks on a single chip because there is more noise between chips. Additionally, the transition time for switching between the two logic states is shortened. Typically, strengthening the signal by providing both a short transition time and large output voltage swing is accomplished by modifying the output driver device size and the connections between the output driver and the logic circuits to provide more current. The same considerations which lead to the modification of the output driver also lead to the modification of the input receiver. The receiver is modified to respond to the large voltage swing over a short transition time. Generally, both input and output functions are incorporated into a single input/output device.

The stronger output signal coupled with a large number of output signals switching in parallel produces a noise problem on a single chip. Part of the noise problem is a result of a change in the current required by the input/output devices when many input/output devices are switched at once. The effects of the changes in current, also called current spikes, on the input/output devices vary depending on the placement of the drivers with respect to the power supply pins on the chip and the design of the power supply bussing. This is because current spikes must pass through the power supply bussing and its parasitic impedance. The placement of a switching input/output device with respect to the power supply pins changes the impedance which the current spikes encounter. Therefore, the voltage dropped across the impedance varies and this produces different effects on the input/output devices and other circuits near the input/output devices. In particular, when a current spike (noise) becomes large enough over a small enough impedance, an input/output device may (depending on its position) switch its logical state unintentionally.

In an effort to reduce overall chip power consumption, the power supply bussing on a chip has the lowest impedance that is practical. A low impedance aggravates the noise problem because the current spike is not damped as it travels through the bussing so that it effects more circuits. Both a larger current spike and smaller impedances are likely when several input/output devices operate in parallel. Therefore, enhancing the signal speed and number of parallel input/output devices makes the chip communication more unreliable because the signals sent may not be correct due to the current noise (also called Delta I noise) in the power supply.

Another part of the Delta I noise is that the current spike is an AC signal capacitively coupled to adjacent input/output devices through the parasitic capacitances between the input/output devices. The placement of the input/output devices determines the impedance through which the current spike passes. This impedance and size of the current spike determine the strength of the voltage signal capacitively coupled to the adjacent devices. If enough voltage is coupled to an adjacent input/output device through several input/output devices switching to one state simultaneously, and therefore having a cumulative effect, then the adjacent input/output device will switch logical state unintentionally. Again, switching logic signals are made more unreliable because of the Delta I noise.

The prior art discloses many solutions to this problem. A first solution is to reduce the speed of the transitions between logic states of the input/output device. The problem with this solution is that the performance of the chip would be limited by the Delta I noise. Another prior art solution is to filter out the current spikes. This technique is effective, however it can be prohibitively expensive because of packaging costs. Still another solution to the Delta I noise problem is to modify the parasitic elements on the power supply bussing for the chip itself. Typically, this is done by using several input/output pins on the chip (rather than a single pin) for power supply connections. However, the number of input/output pins on a VLSI logic chip is generally limited. Therefore, the functionality of the chip is limited because the number of pins useful for logic signals is limited due to allocating extra pins for the power supply.

OBJECTS

It is an object of this invention to enhance the reliability of signals sent between integrated circuit chips.

It is a further object of this invention enhance the performance of communications between integrated circuit chips.

It is another object of this invention to enhance the functionality of integrated circuit chips.

It is still a further object of this invention to reduce the effect of switching noise on an integrated circuit chip.

It is still another object of this invention to reduce the effect of output switching noise on an integrated circuit chip without increasing the circuit packaging cost.

It is still a further object of this invention to reduce design constraints imposed on integrated circuit chips by switching noise.

SUMMARY OF THE INVENTION

This invention reduces the Delta I noise on an integrated circuit chip by reducing the changes in current supply required for transitions in logic states of the input/output devices. The invention uses a 3/6 binary code for communicating between integrated circuit chips. This code uses six bits to represent the 16 hex code digits typically used for computer instructions. Three of the six bits are in a high logic state and three of the six bits are in a low logic state for all 16 hexadecimal (hex) code representations. Therefore, changing from any one logic state to another, does not change the overall current supply required by the six input/output devices. Groups of six input/output devices (corresponding to the 3/6 code) are located relatively close to each other with respect to the power supply pins which supply current to the six input/output devices. As a result, there is a high to low transition for every low to high transition over similar parasitic impedances on the input/output devices. This leads to low Delta I noise because the current spikes created by individual transitions over the power supply bussing cancel each other out when viewed as a six device group. Also, the Delta I noise is lowered because capacitively coupled signals cancel each other out. The high overhead pin count for a six digit code instead of the normal four digit code for hex representation is compensated for because input/output pins normally replaced by extra power supply pins (to reduce Delta I noise) can be used as input/output pins. Therefore, the 3/6 code frees up extra input/output pins when the Delta I noise would normally force those pins to be used for the circuit power supply.

Preferred Embodiment

Figure 1:
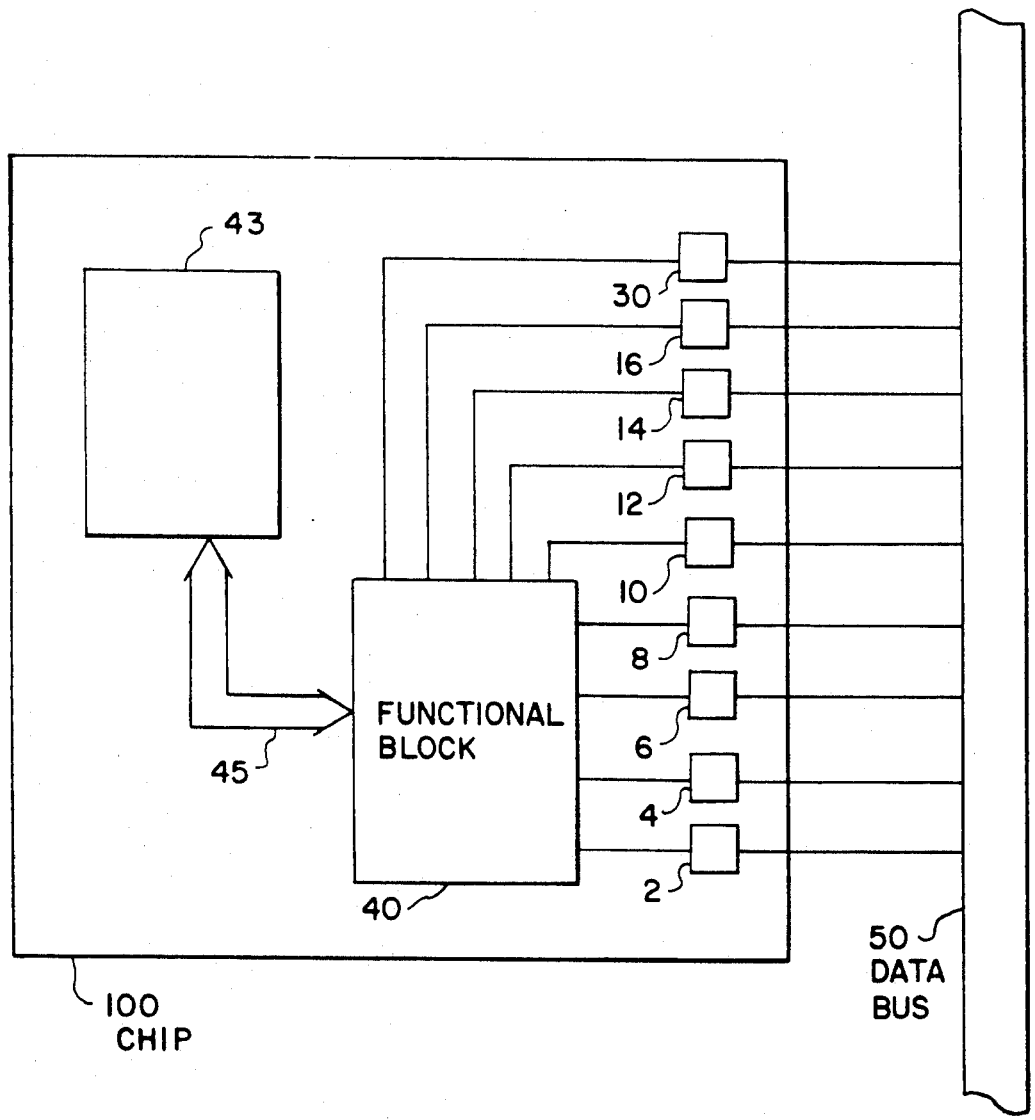
FIG. 1 illustrates the prior, art technique for interconnecting an integrated circuit to a data bus.

FIG. 1 illustrates the prior art method of sending or receiving data to or from an integrated circuit chip. The integrated circuit chip 100 contains a plurality of functional blocks. A functional block is a means for processing data which the chip 100 receives from a data source over the data source or bus 50. The functional block typically carries out (either in part or in full) instructions or performs calculations on data received over the data source 50. The data source is typically a data bus or another chip, however, it can be other devices which together with the chip form a computer system. The functional block 40 communicates with other chips through a data bus 50. The data bus 50 is connected to the functional block 40 through a plurality of input/output devices, 2, 4, 6, 8, 10, 12, 14, and 16. The input/output devices are common in the art and send and/or receive a single bit of data. The functional block 40 communicates with functional block 43 through chip data bus 45.

The functional block 40 operates on combinations of bits of data. Typically, two groups of four bits plus a parity bit form the smallest combination of bits operated on by the functional block. This combination of nine bits is called a byte. Bytes are appended together to encode communications between a chip 100 and a data source. Each subcombination of four binary digits can be assigned a single hex code digit, and a pair of hex code digits are operated on by the functional block 40. The parity bit is a means for checking the integrity of the data bits in the byte of data and is carried as extra information in the byte. The parity bit is transmitted to and from data bus 50 through input/output device 30. Two or more bytes form a word, and words are commonly used to transmit data to and from the data bus 50. Word sizes vary depending on the architecture of the computer system.

Figure 2:
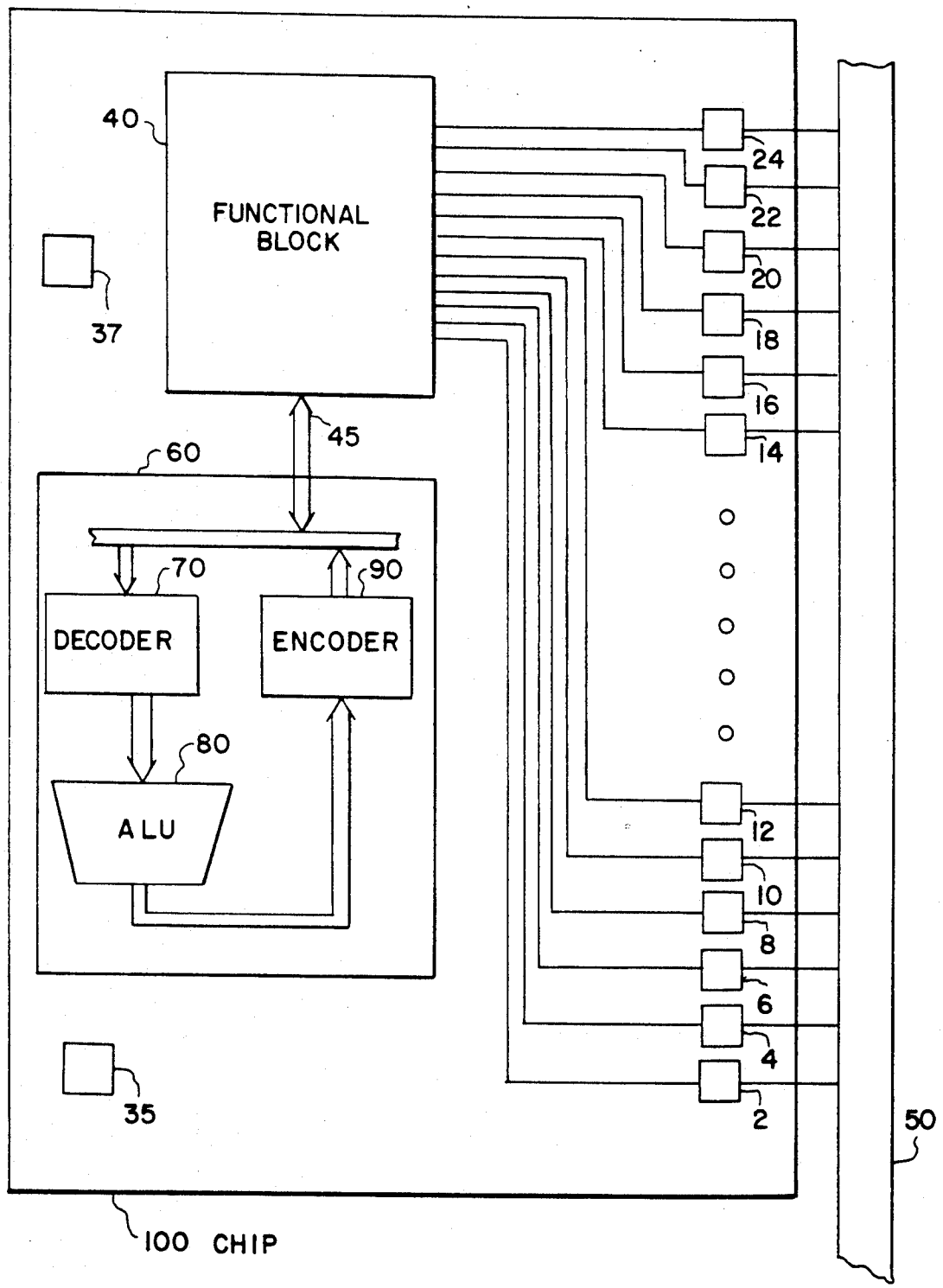
FIG. 2 illustrates the present invention technique for interconnecting an integrated circuit to a data bus.

FIG. 2 illustrates an implementation of the present invention. Chip 100 contains functional blocks 40 and 60. Functional block 40 receives at least two groups of six data inputs from data bus 50 through a plurality of input/output devices 2, 4, 6, 8, 10, 12, 14, 16, 18, 20, 22, and 24. The 12 bits received by the functional block 40 form a data byte in 3/6 code. The functional block 40 either performs operations assigned to the data byte received or passes the byte onto another functional block 60 to be decoded into a different form for a separate use. The functional block 40 communicates with functional block 60 through chip data bus 45. The 3/6 coded data byte is received by decoder 70 from chip data bus 45 and the resulting decoded data (as conventional binary representation) is sent to the arithmetic logic unit (ALU) 80. The ALU performs a mathematical operation on the decoded data and sends a result to the encoder 90. The encoder 90 transforms the binary result into a 3/6 code result and sends the 3/6 code result back to the functional block 40. The data bus 50 receives the resulting data from the functional block 40 through the plurality of input/output devices.

Figures 3A, 3B:
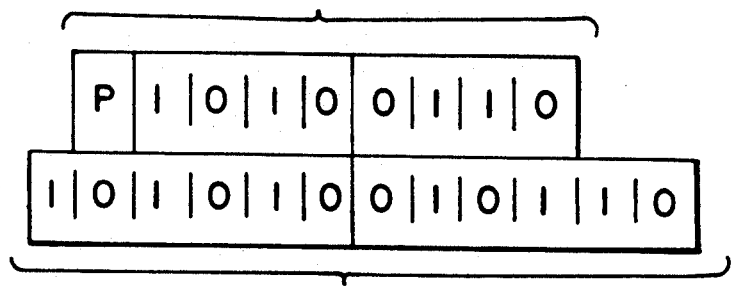
FIGS. 3a-3b illustrates the 3/6 code with respect to both binary and hexadecimal code.

In the present invention the smallest group of bits on which the functional block 40 operates is six bits. The six bits used could have 64 binary combinations ($2^6 = 64$). However, only 16 of the 64 possible combinations are assigned a functional value. Each of the 16 groups used are assigned a hex digit. The hex digits assigned to the 16 combinations of six bits are illustrated in FIG. 3(a). The combinations of the six bits form a three out of six (3/6) code. The use of six bits, 3 of which are in a high state and 3 of which are in a low state, has 20 possible code points. There are 20 unique permutations of six bits chosen 3 at a time as shown by:

$$N!/(K!(N-K)!)$$

where N=number of bits, and K=number of binary bits chosen at one time (!=factorial notation).

In the present invention, only 16 of the 20 unique permutations are used. This is to maintain simplicity in mapping the hex code to the 3/6 code. However, this simplicity does not preclude the use of all 20 code points and assigning those 20 code points to different hex values than are indicated by FIG. 3(a).

The 3/6 code maintains three high bits and three low bits at all times. Maintaining three high and three low bits at all times significantly reduces the change in current supply to the input/output which occurs when a binary code of all lows switches to a binary code of all highs. In FIG. 1 for example, a logic state of hex code 00 switching to hex code FF in binary would create a significant change in power supply current to the input/output devices during the logic state switch. This change in current would be in the same direction (that is adding more current or subtracting current) from each input/output device because each device switches the same way (i.e., low to high or high to low). The current spike is high because the logic transitions are all in the same direction on many parallel input/output devices and this will result in Delta I noise problems.

In contrast, when the 3/6 code is used as in FIG. 2, the 00 to FF logic state transition moves the current supply between different devices. The 3/6 code maintains the overall current supply to the six input/output devices as a constant. This minimizes the current spike passing through the power supply bussing. Additionally, the current spikes which do occur, on separate impedances of the power supply bussing to the individual input/output devices, are similar in magnitude to each other but opposite in transition. The spikes are similar in magnitude because the input/output devices are physically grouped by 6 bit code and as a result have similar impedances. The spikes are opposite in transition because for every high to low transition in the 3/6 code, there is a low to high transition. This means that whenever a transition is made from low to high causing a current spike in a parasitic impedance, a similar transition is made from high to low causing an opposite current spike over a similar impedance. These competing current spikes cancel each other out in the average capacitive coupling effect on the input/output devices. Therefore there are fewer Delta I noise problems on the chip 100 regardless of the logic state transition because the current spikes effecting the voltage on an individual input/output device or other circuits are minimal and the capacitive coupling between input/output devices tends to cancel out.

The 3/6 code is similar in function to the conventional binary code because both codes assign a hex code integer to a subcombination of bits in the data byte. FIG. 3(b) illustrates how the hex code A6 is coded in a conventional binary code and how hex code A6 is coded in the 3/6 code. Each hex code integer, or combination of integers, is assigned a function in the chip 100. That function is invoked by the chip when it receives the specific combination of binary integers assigned to the hex code. The difference in the 3/6 code from the typical binary code is that the 3/6 code uses six binary digits instead of four. The two extra bits are used to maintain a balanced state (i.e., equal number of high and low binary digits) on the input/output devices. The use of a balanced logic state compensates for the use of extra bits because when the word size (groups of data bytes) and the speed of the logic state transitions are increased, traditional hex coded systems require extra power supply pins. Those extra power supply pins are not required when a balanced logic state is used.

A measure of the effectiveness of the reduction in Delta I switching noise is how many power supply pins can be eliminated because of using this code. A prior art integrated circuit having 228 input/output devices and 240 power supply pins is expected to convert 120 power supply pins into input/output devices by using the 3/6 code. Such an increase in the availability of input/output pins greatly increases the functionality of individual chips. This is because having more power supply pins leaves less physical space for input/output devices. As a result, the logic associated with the input/output devices has to be moved to another chip. Partitioning logic into multiple chips is a more complex design problem due to communications between chips rather than communications between devices on a single chip. Therefore, reducing the number of power supply pins increases the number of logic functions used on a single chip and reduces the overall design complexity of the chip.

Alternatively, instead of converting all of the 120 power supply pins into input/output pins, the performance of the existing input/output devices could be increased. The existing logic transitions do not produce spikes large enough to produce a noise problem because of the use of the 3/6 code. The existing logic transitions can be made shorter, when using the 3/6 code, until the spikes do become a noise problem. Additionally, the 3/6 code does not require the use of the parity bit, illustrated in FIG. 3(b) as P, which is used in conventional binary code. This is because when the number of high and low logic states are equal, parity is checked by examining the word for the equal number of states. This requires logic circuits on the chip rather than carrying an extra bit with each byte. As a result, the complexity of handling transferred data is reduced with the 3/6 code. Therefore, in improving either function, performance, or complexity of design, the use of the 3/6 code enhances the overall ability to use the existing integrated circuit technology.

Figure 4:
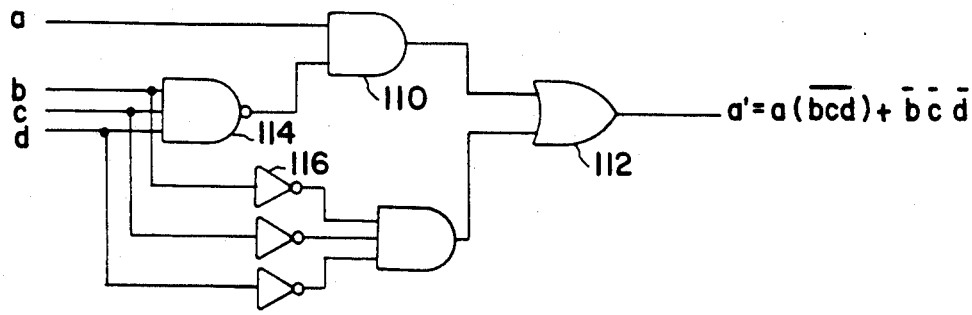
FIG. 4 illustrates the logical conversion of 3/6 code to binary code.
Figure 4:
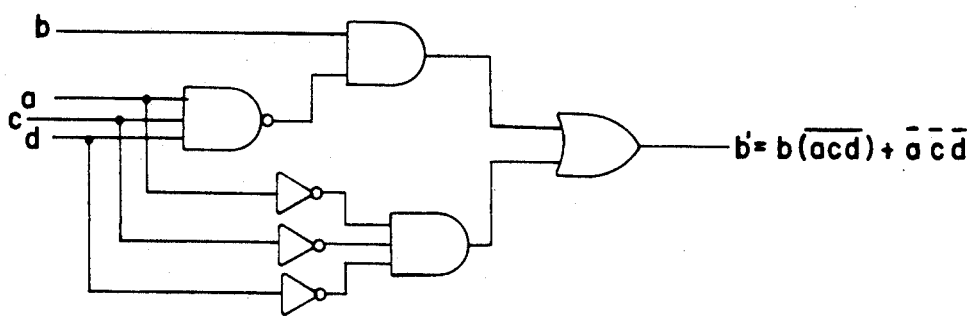
Figure 4:
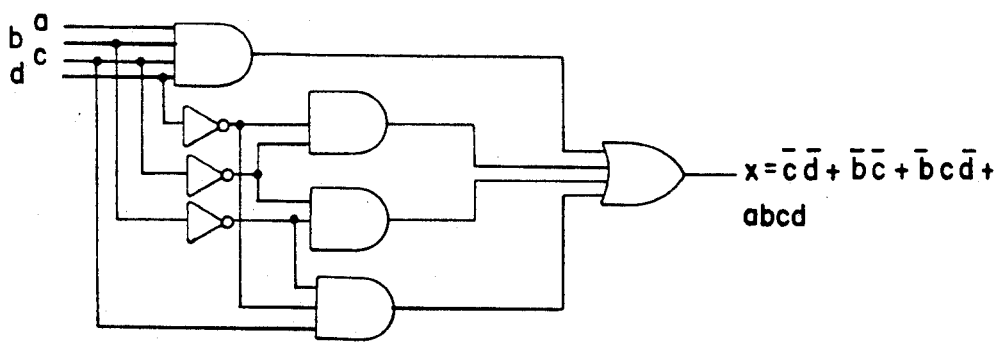
Figure 4:
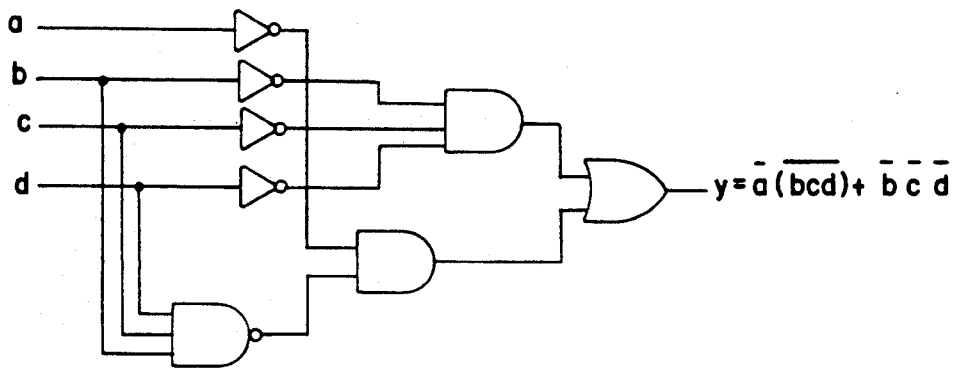
Figure 5:
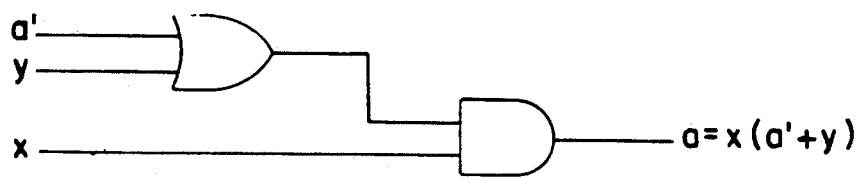
FIG. 5 illustrates the logical conversion of binary code to 3/6 code.
Figure 5:
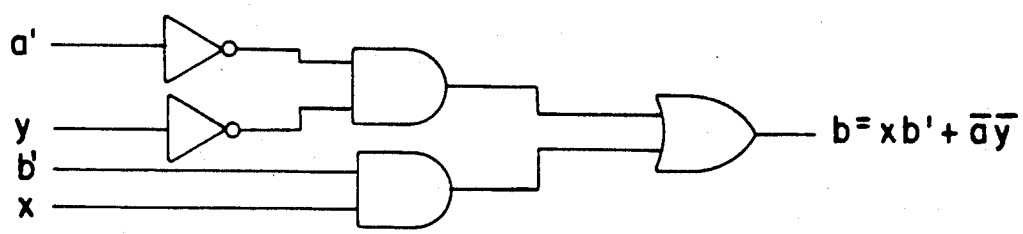

FIG. 3(a) illustrates a comparison of the rightmost four digits of the 3/6 code (a', b', c', d') to the four digits of the binary code (a, b, c, d) which are in turn associated with the hex digits. The comparison illustrates that the binary code digits are the same as the 3/6 code digits except for two cases. Those two cases are hex code O and hex code F. The translation from the conventional binary code to the 3/6 code for each binary digit in the four bit subcombination of the data byte is shown in FIG. 4. The translation represents the case when all logical transitions between hex codes remain balanced. Given the translation from binary into 3/6 code in terms of basic logic functions (such as AND 110, OR 112, NAND 114, and Inverter 116 gates) as shown in FIG. 4, the implementation of the combinations of basic logic functions is well known. FIG. 4 illustrates a reduced boolean logic combination used to translate the conventional binary code digits; a, b, c, and d into 3/6 code digits; x, y, a', b', c', and d'. This implementation requires approximately 12 to 15 logic circuits and 2 stages of delay for each hex digit. Similarly, the reduced logical functions required to translate from 3/6 code into binary are shown in FIG. 5.

Operating instructions on a chip 100 do not inherently require a specific representation. The instructions are merely labeled with a binary code and that label is arbitrary. Therefore, the functions of each operating instruction are easily mapped from conventional binary code into 3/6 code because a 3/6 code label can be substituted for the binary code label. No signal conversion (from a conventional binary code into 3/6 code) on the chip is necessary for functional block 40 to implement the operating instructions in 3/6 code. However, when arithmetic values are passed to the chip 100 for use in a functional block which performs mathematical operations, a value conversion is required. This is because the 3/6 code does not represent a number system capable of mathematical manipulation as does the conventional binary code.

A method of performing this value conversion is shown in FIG. 2. The value to be operated on is received by the functional block 40 from the bus 50 through a plurality of input/output devices 2, 4, 6, 8, 10, 12, 14, 16, 18, 20, 22, and 24. The value is sent directly to a functional block 60 through the chip data bus 45. The functional block 60 contains a decoder 70, an ALU 80, and an encoder 90. The functional block 60 receives the 3/6 code and decodes it through the decoder 70 which implements the 3/6 to binary code conversion illustrated in FIG. 5. The binary data is then sent to the ALU 80, which performs the mathematical functions. The ALU 80 outputs the result to an encoder which performs the binary to 3/6 code conversion illustrated in FIG. 4. The encoder then outputs the data back to the functional block 40 through the chip data bus 45 and subsequently onto the bus 50 through the plurality of input/output devices. Other methods of implementing this conversion are within the scope of this invention. Such methods as performing the decoding right after the data is received by the input/output devices and then operating the chip on the conventional binary code assignment to instructions (with respect to the hex code) as well as using the conventional binary code for mathematical processes are contemplated by this invention. This is because these methods implement the invention's technique of receiving the communication signals over the input/output devices such that all logic states have an equal number of high and low bits.

The implementation of the 3/6 code for data transfer by itself helps reduce the Delta I noise because current spikes in the power supply bussing are reduced. However, this code is especially effective when the input/output devices are physically grouped by their 3/6 code group. Placing devices by the 3/6 code group means that the six input/output devices 2, 4, 6, 8, 10, and 12, which form a first half of a data byte, are physically located near or in proximity to each other with respect to the power supply pins on the chip. Other groups of six input/output devices (again grouped by their 3/6 code) can be placed at various locations on the chip as long as they are grouped together.

In FIG. 2 for example, devices 14, 16, 18, 20, 22, and 24 form a second half of a data byte and are separated from the group of devices which form the first half of the data byte. This separation is on the order of a millimeter with a input/output device (center to center) pitch of approximately 200 microns. The separation and pitch values are only approximate because they will depend to a great degree on the technology, circuits, functions, layout, and packaging of the integrated circuits. Therefore, the separation and pitch values will vary on each integrated circuit designed. However, as long as they are grouped together, the switching effects from the capacitive coupling on adjacent input/output devices will cancel out. Here, each input/output device in the first group is a similar (although not equal) distance from the power supply pin 35. Each input/output device in the second group is also a similar distance from the power supply pin 37. The Delta I noise effects are small because the impedances to the individual input/output devices are similar due to the similar placement of the input/output devices with respect to the power supply pins. The cancelling effect is also due to the fact that for every high to low transition, there is a low to high transition in its vicinity. Additionally, because the total current going to the group remains relatively constant, there is a lower current spike passing through the power supply bussing.

The ability to group input/output pins by code group so as to affect the switching noise does not exist in conventional binary code systems because there is no guarantee of a subset of signals providing a noise cancellation effect. In this invention, when some input/output devices in the 3/6 code make the transition from high to low, that same number of input/output devices will make the transition from low to high. Therefore, the current drawn from the power supply for a group will remain uniform within a group and parasitic impedances between groups will not be detrimental to circuit performance.

While this invention has been particularly described and illustrated with reference to a preferred embodiment of a 3/6 code, this invention encompasses any balanced code (X digits / 2X digits). In particular, it will be understood by those skilled in the art that changes in the above description or illustrations may be made with respect to form or detail without departing from the spirit and scope of the invention.

What is claimed is:

1. A method for reducing switching noise in an integrated circuit, comprising:

placing an even number of input/output devices on an integrated circuit chip, said input/output devices connect said integrated circuit to a data source;

encoding communications between said integrated circuit and said data source wherein said encoded communications switch an input/output device to a high logic state for each input/output device which said encoded communications switch to a low logic state; and transferring said encoded communications between said integrated circuit and said data source through said even number of input/output devices.

2. A method for reducing switching noise in an integrated circuit, as in claim 1, wherein:

said encoded communications switch a first plurality of said input/output devices to a high logic state when said encoded communications switch a second plurality of input/output devices to a low logic state; and said first and second plurality of input/output devices are placed in proximity to each other with respect to power supply pins on said integrated circuit.

3. A method for reducing switching noise in an integrated circuit, as in claim 2, wherein:

said first plurality of input/output devices consists of three input/output devices and said second plurality of input/output devices consists of three input/output devices.

4. A method for reducing switching noise in an integrated circuit, as in claim 2, wherein:

said data source is a second integrated circuit having an even number of input/output devices.

5. A method for reducing switching noise in an integrated circuit, as in claim 3, wherein:

said encoded communications represent a plurality of fixed length binary data streams with six bit binary combinations consisting of:

01 1100
11 0001
11 0010
01 0011
11 0100
01 0101
01 0110
00 0111
11 1000
10 1001

10 1010
00 1011
10 1100
00 1101
00 1110
10 0011.

6. A method for reducing switching noise in an integrated circuit, as in claim 4, wherein:
said encoded communications switch a first plurality of input/output devices on said second integrated circuit to a high logic state when said encoded communications switch a second plurality of input/output devices on said second integrated circuit to a low logic state.

7. A method for reducing switching noise in an integrated circuit, as in claim 5, wherein:
said data source is a data bus.

8. A method for reducing switching noise in an integrated circuit, as in claim 5, wherein:
said data source is a second integrated circuit having an even number of input/output devices.

9. A method for reducing switching noise in an integrated circuit, as in claim 8, wherein:
said encoded communications switch a first plurality of input/output devices on said second integrated circuit to a high logic state when said encoded communications switch a second plurality of input/output devices on said second integrated circuit to a low logic state.

10. An integrated circuit for processing data from a data source, comprising:
a data processing means connected to a plurality of input/output devices;
said data processing means communicates with said data source through said plurality of input/output devices;
said plurality of input/output devices switch between a first and a second logic state when said data processing means communicates with said data source through said input/output devices; and
said plurality of input/output devices have an equal number of input/output devices in said first logical state as in said second logical state.

11. An integrated circuit, as in claim 10, wherein:
said plurality of input/output devices are connected to a plurality of power supply pins; and
said plurality of input/output devices are grouped together with respect to said plurality of power supply pins on said integrated circuit.

12. An integrated circuit, as in claim 10, wherein:
said plurality of input/output devices comprises six input/output devices.

13. An integrated circuit, as in claim 11, wherein:
said plurality of input/output devices comprises four input/output devices.

14. An integrated circuit, as in claim 11, wherein:
said plurality of input/output devices comprises six input/output devices.

15. An integrated circuit, as in claim 11, wherein:
said plurality of input/output devices comprises eight input/output devices.

16. An integrated circuit, as in claim 11, wherein:
said plurality of input/output devices comprises ten input/output devices.

17. An integrated circuit, as in claim 11, wherein:
said plurality of input/output devices comprises twelve input/output devices.

18. An integrated circuit, as in claim 12, wherein:
a hex code represents said communication between said data source and said data processing means;
said hex code corresponds to a 3/6 code as follows;

| HEX | 3/6 |
| --- | --- |
| 0 | 01 1100 |
| 1 | 11 0001 |
| 2 | 11 0010 |
| 3 | 01 0011 |
| 4 | 11 0100 |
| 5 | 01 0101 |
| 6 | 01 0110 |
| 7 | 00 0111 |
| 8 | 11 1000 |
| 9 | 10 1001 |
| A | 10 1010 |
| B | 00 1011 |
| C | 10 1100 |
| D | 00 1101 |
| E | 00 1110 |
| F | 10 0011. |

19. An integrated circuit, as in claim 14, wherein:
a hex code represents said communication between said data source and said data processing means;
said hex code corresponds to a 3/6 code as follows;

| HEX | 3/6 |
| --- | --- |
| 0 | 01 1100 |
| 1 | 11 0001 |
| 2 | 11 0010 |
| 3 | 01 0011 |
| 4 | 11 0100 |
| 5 | 01 0101 |
| 6 | 01 0110 |
| 7 | 00 0111 |
| 8 | 11 1000 |
| 9 | 10 1001 |
| A | 10 1010 |
| B | 00 1011 |
| C | 10 1100 |
| D | 00 1101 |
| E | 00 1110 |
| F | 10 0011. |

* * * * *